US008436068B2

(12) United States Patent
Yang et al.

(10) Patent No.: US 8,436,068 B2
(45) Date of Patent: May 7, 2013

(54) COMPOSITION AND POLYMER

(75) Inventors: Feng-Yu Yang, Zhubei (TW); Meei-Yu Hsu, Kaohsiung (TW); Gue-Wuu Hwang, Hsinchu (TW); Po-Yuan Lo, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 36 days.

(21) Appl. No.: 13/094,138

(22) Filed: Apr. 26, 2011

(65) Prior Publication Data

US 2012/0108697 A1 May 3, 2012

(30) Foreign Application Priority Data

Oct. 27, 2010 (TW) .............................. 99136869 A

(51) Int. Cl.
| | |
|---|---|
| C08F 2/50 | (2006.01) |
| A61K 6/083 | (2006.01) |
| C08G 59/32 | (2006.01) |
| C08L 39/04 | (2006.01) |
| C09B 67/00 | (2006.01) |
| C08F 18/20 | (2006.01) |

(52) U.S. Cl.
USPC ............... 522/33; 522/62; 522/109; 525/186; 525/204; 525/199; 524/516; 524/502; 526/245; 526/326; 526/311

(58) Field of Classification Search ............ 522/33, 522/62, 109; 257/40, 410; 438/82, 99, 780; 525/186, 199, 204; 524/502, 516; 526/245, 526/311, 326

See application file for complete search history.

(56) References Cited

U.S. PATENT DOCUMENTS

| | | | | |
|---|---|---|---|---|
| 3,882,084 A * | 5/1975 | Tato et al. ........................ | 526/245 |
| 6,258,507 B1 * | 7/2001 | Ochiai et al. .................. | 430/270.1 |
| 7,238,961 B2 * | 7/2007 | Bernds et al. ................... | 257/40 |

| 2008/0161464 A1 | 7/2008 | Marks et al. |
| 2008/0161524 A1 | 7/2008 | Yan et al. |

OTHER PUBLICATIONS

Hirano et al., JP 2009-086354; machine English translation, Apr. 2009.*
Cho et al., KR 2009-0036845; machine English translation, Jan. 2012.*
Lo, P.Y., et al.; "A Stable Top-Gate P3HT OTFT by a Photo-Cured Cinnamate-Based Polymer Dielectric;" pp. 1-8.
Yang, F.Y., et al.; "Cinnamate-Based Polymer Composites as Gate Dielectrics for Organic Transistors;" pp. 1-2.
Klauk, H., et al.; "High-Mobility Polymer Gate Dielectric Pentacene Thin Film Transistors;" Journal of Applied Physics; vol. 92; No. 9; Nov. 1, 2002; pp. 5259-5263.
Jang, Y., et al.; "Influence of the Dielectric Constant of a Polyvinyl Phenol Insulator on the Field-Effect Mobility of a Pentacene-Based Thin-Film Transistor;" Applied Physics letters; No. 87; 2005; pp. 152105-1-152105-3.
Yoon, M.H., et al.; "Low-Voltage Organic Field-Effect Transistors and Inverters Enabled by Ultrathin Cross-Linked Polymers as Gate Dielectrics;" Journal of American Chemical Society Articles; Jun. 30, 2005; pp. 10388-10395.
Lee, T.W., et al.; "Photocurable Organic Gate Insulator for the Fabrication of High-Field Effect Mobility Organic Transistors by Low Temperature and Solution Processing;" Advanced Materials; 2007; pp. 2702-2706.
Lee, S.H., et al; "High Performance Organic Thin-Film Transistors with Photopatterned Gate Dielectric;" Applied Physics Letters; No. 90; 2007; pp. 033502-1-033502-3.
Yang, F.Y., et al; "High-Performance Poly(3-Hexylthiophene) Transistors with Thermally Cured and Photo-Cured PVP Gate Dielectrics;" Journal of Materials Chemistry; No. 18; 2008; pp. 5927-5932.

* cited by examiner

*Primary Examiner* — Michael Pepitone
*Assistant Examiner* — Jessica Roswell
(74) *Attorney, Agent, or Firm* — McClure, Qualey & Rodack, LLP

(57) ABSTRACT

A composition and a polymer are provided. The composition includes the polymer and a melamine derivative. The polymer has a formula of

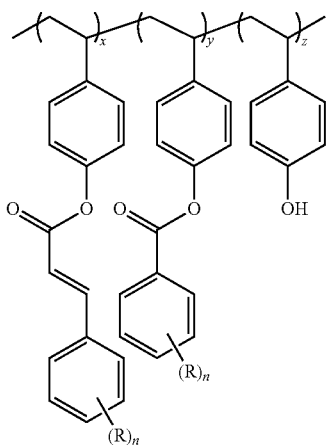
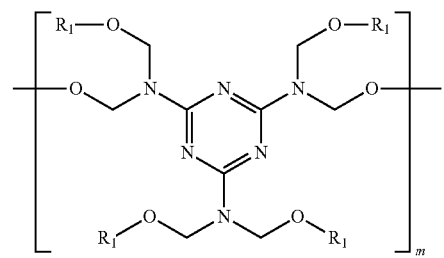
$R_1$ is hydrogen, $C_qH_{2q+1}$, or
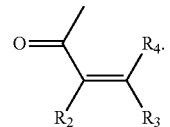
R is hydrogen, halide, alkyl group, alkoxyl group, haloalkyl group or nitro group. n is 1-5 of integer. x+y+z=1, x>0, y≧0, z≧0. The melamine derivative includes
m and q independently is 1-10 of integer. $R_2$, $R_3$ and $R_4$ independently is hydrogen, halide, or $C_1$-$C_{54}$ alkyl group.
10 Claims, 3 Drawing Sheets

COMPOSITION AND POLYMER

BACKGROUND

1. Technical Field

The disclosure relates in general to a composition and a polymer, and more particularly to a composition and a polymer for forming a crosslinked polymer compound.

2. Description of the Related Art

An organic thin film transistor (OTFT) is superior to an inorganic thin film transistor due to an advantage of low temperature process and low cost in application for a large scale display device. Therefore, in recent years, many researches about materials and processes for the OTFT have been developed. The current research focuses on a gate dielectric layer using silicon oxide mainly. However, the material of the OTFT has to trend to the whole plastic for suiting to a big-area and low-cost process such as a printing process. Thus, it is very important to develop an organic polymer material for the gate dielectric layer.

SUMMARY

Embodiments disclosed herein may provide a composition. The composition may comprise a polymer and a melamine derivative. The polymer may have a formula of

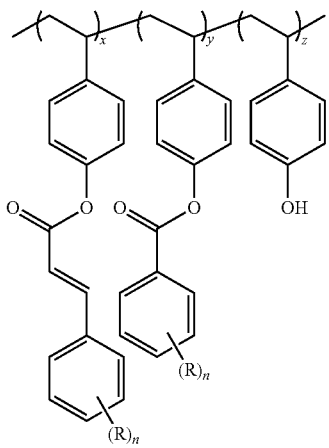

R may be hydrogen, halide, alkyl group, alkoxyl group, haloalkyl group or nitro group. Said halide is a halogen containing functional group, comprising, but not limited to, halogen, a haloalkyl group, etc.
n may be 1-5 of integer. x+y+z=1, x>0, y≧0, z≧0. The melamine derivative may comprise

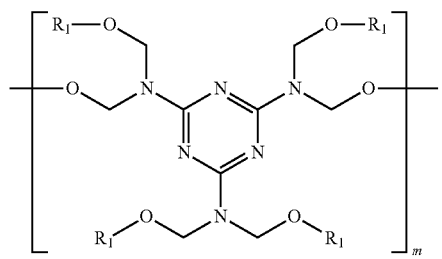

$R_1$ is be hydrogen, $C_qH_{2q+1}$ or

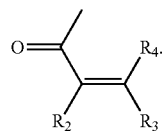

m and q independently may be 1-10 of integer. $R_2$, $R_3$ and $R_4$ independently may be hydrogen, halide, or $C_1$-$C_{54}$ alkyl group.

Embodiments disclosed herein may provide a polymer. The polymer may have a chemical formula of:

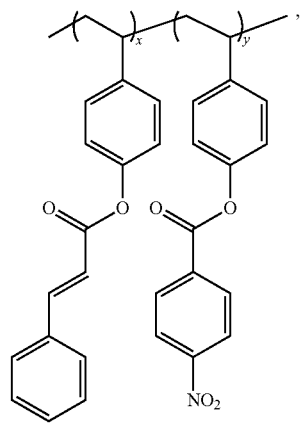

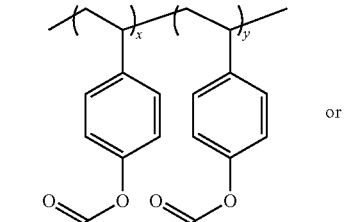

or

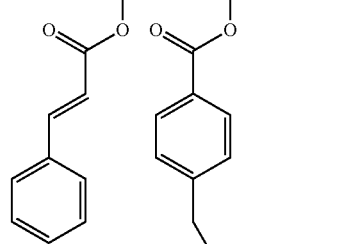

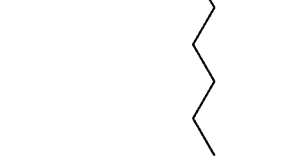

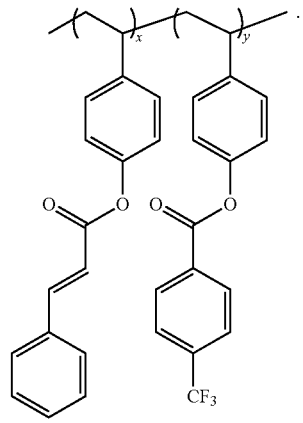

x + y = 1, x > 0, y ≧ 0.

The above and other aspects of the disclosure will become better understood with regard to the following detailed description of the non-limiting embodiment(s). The following description is made with reference to the accompanying drawings.

DETAILED DESCRIPTION

Figure 1:
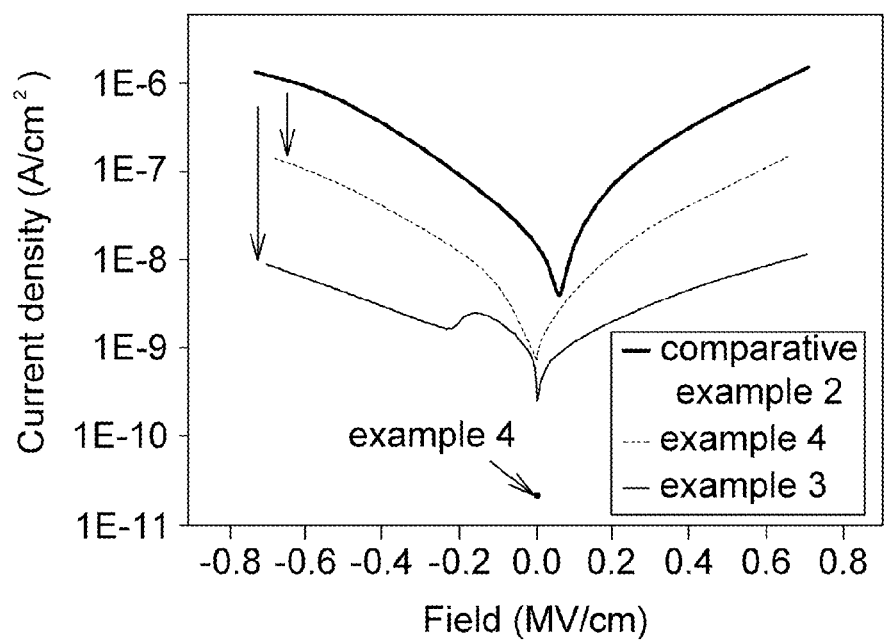
FIG. 1 illustrates I-V response results of the MIM capacitor structures of comparative example 2, example 3 and example 4.

In embodiments, a polymer compound is provided. The polymer compound is formed by a composition. The composition comprises a polymer and a melamine derivative. The polymer may have a chemical formula of:

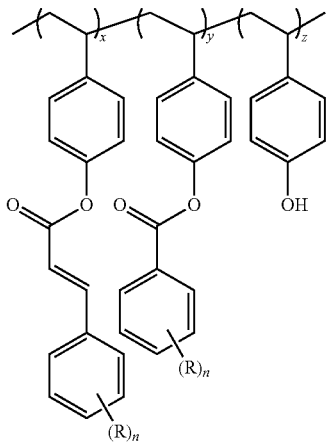

R may be hydrogen, halide (that is, a halogen containing functional group), alkyl group, alkoxyl group, haloalkyl group or nitro group. n may be 1-5 of integer. x+y+z=1, x>0, y≧0, z≧0.

The melamine derivative may comprise

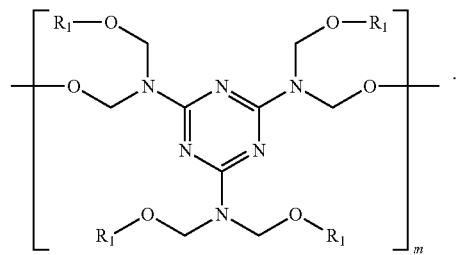

$R_1$ may be hydrogen, $C_qH_{2q+1}$ or

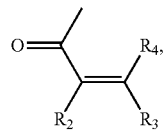

m and q independently may be 1-10 of integer.

$R_2$, $R_3$ and $R_4$ independently may be hydrogen, halide, or $C_1$-$C_{54}$ alkyl group.

The composition may further comprise a crosslinking agent. The crosslinking agent may comprise

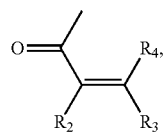

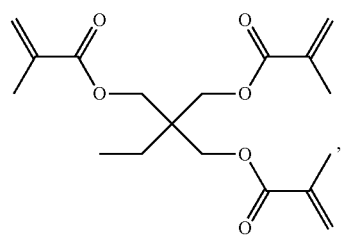

TMA

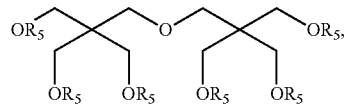

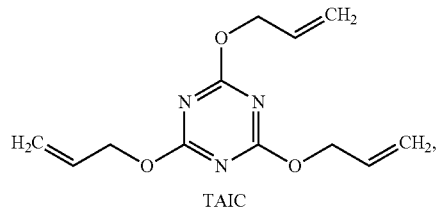

TAIC or a combination thereof.

$R_2$, $R_3$ and $R_4$ may independently be hydrogen, halide, or $C_1$-$C_{54}$ alkyl group. $R_5$ may be hydrogen or

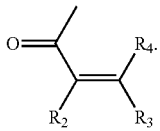

In some embodiments, the polymer may have a chemical formula of:

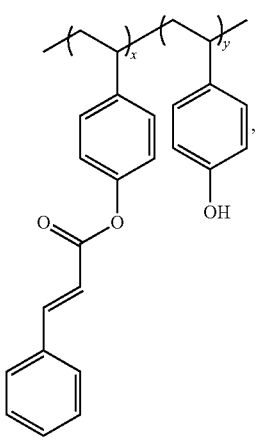

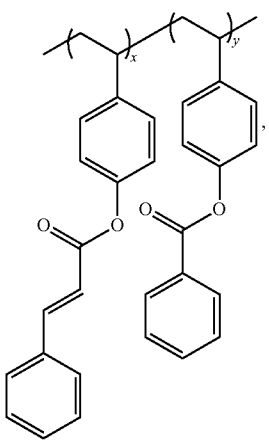

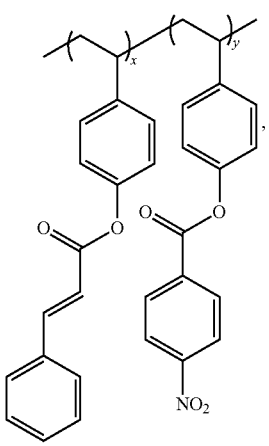

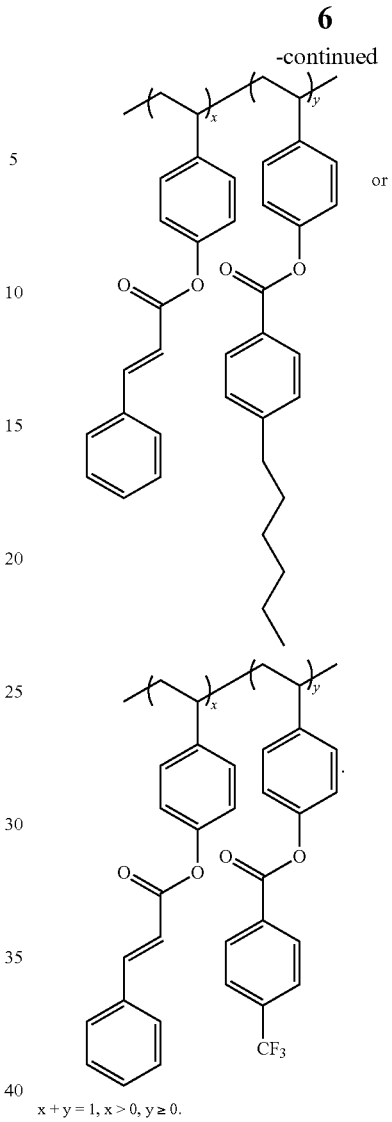

$x + y = 1, x > 0, y \geq 0$.

The composition may further comprise an additive agent. The additive agent may comprise siloxane, benzophenone, 2-hydroxyl-2-methyl propiophenone, azobisisobutyronitrile, or a combination thereof.

In embodiments, the crosslinked polymer compound is used for a dielectric material, having excellent properties. The crosslinked polymer compound has an excellent stability in the atmosphere. The dielectric constant of the crosslinked polymer compound does not change almost, even the crosslinked polymer compound has been placed in the atmosphere over one week. In addition, the leakage current density is small and the insulating effect is excellent. The crosslinked polymer compound is used as a gate dielectric layer for a thin film transistor or used as a dielectric layer for a capacitor structure for improving the electrical performance of the device.

The composition may be crosslinked by an irradiating method. For example, the composition may be crosslinked by irradiating with UV light of an exposure dose of 0.5-20 J/cm².

The advantages of the present disclosure are illustrated with the following examples of the present disclosure and comparative examples.

Crosslinkable Polymer

PVPC19 (x=19%, y=81%)

A solution comprising poly(vinylphenol) (2.0 g, Mw=20000 g/mol), 30 mL of anhydrous tetrahydrofuran (THF) and 5 mL of tripropylamine is placed in an ice bath for 10 minutes, and then is dissolved in 5 mL of anhydrous tetrahydrofuran solution of trans-3-phenylacryloyl chloride (0.555 g). After an overnight stirring, about 1.8 g of white PVPC19 polymer is obtained by filtering the reaction mixture and purifying the precipitate polymer. The $^1$H NMR analysis (500 MHz, d-acetone+D$_2$O (1 drop)) result of the PVPC19 polymer is: δ=1.0-2.0 (m, —CHCH$_2$—), δ=6.2-7.2 (m, —C$_6$H$_4$OH & —CH=CH—), δ=7.3-8.0 (m, —CH=CHC$_6$H$_5$).

The PVPC crosslinkable polymer has the chemical formula (I).

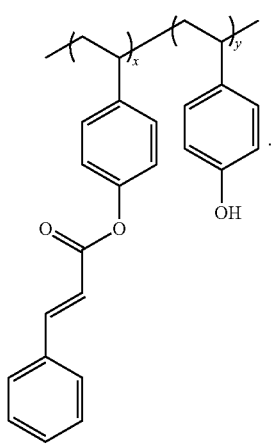

(I)

In this example, x is 19%, and y is 81%.

PVPC35 (x=35%, y=65%)

PVPC35 polymer is manufactured by a method similar with the method the PVPC19 polymer (x=19%, y=81%) is manufactured by except that 1.39 g of trans-3-phenylacryloyl chloride is used for the PVPC35 polymer. About 1.35 g of white PVPC35 polymer is obtained. The $^1$H NMR analysis (500 MHz, d-acetone+D$_2$O (1 drop)) result of the PVPC35 polymer is: δ=1.0-2.0 (m, —CHCH$_2$—), δ=6.2-7.2 (m, —C$_6$H$_4$OH & —CH=CH—), δ=7.3-8.0 (m, —CH=CHC$_6$H$_5$).

In this example, the PVPC35 polymer has the chemical formula (I). x is 35%, and y is 65%.

PVPC60 (x=60%, y=40%)

PVPC60 polymer is manufactured by a method similar with the method the PVPC19 polymer (x=19%, y=81%) is manufactured by except that 1.748 g of trans-3-phenylacryloyl chloride is used for the PVPC60 polymer. About 1.35 g of the white PVPC60 polymer is obtained. The $^1$H NMR analysis (500 MHz, d-acetone+D$_2$O (1 drop)) result of the PVPC60 polymer is: δ=1.0-2.0 (m, —CHCH$_2$), δ=6.2-7.2 (m, —C$_6$H$_4$OH & —CH=CH—), δ=7.3-8.0 (m, —CH=CHC$_6$H$_5$).

In this example, the PVPC60 polymer has the chemical formula (I). x is 60%, and y is 40%.

PVPC70 x=70%, y=30%)

PVPC70 polymer is manufactured by a method similar with the method the PVPC19 polymer (x=19%, y=81%) is manufactured by except that 2.44 g of trans-3-phenylacryloyl chloride is used for the PVPC70 polymer. About 2.44 g of the white PVPC70 polymer is obtained. The $^1$H NMR analysis (500 MHz, d-acetone+D$_2$O (1 drop)) result of the PVPC70 polymer is: δ=1.0-2.0 (m, —CHCH$_2$), δ=6.2-7.2 (m, —C$_6$H$_4$OH & —CH=CH—), δ=7.3-8.0 (m, —CH=CHC$_6$H$_5$).

In this example, the PVPC70 polymer has the chemical formula (I). x is 70%, and y is 30%.

PVPC100 (x=100%, y=0%)

PVPC100 polymer is manufactured by a method similar with the method the PVPC19 polymer (x=19%, y=81%) is manufactured by except that 4.5 g of trans-3-phenylacryloyl chloride is used for the PVPC100 polymer. About 3.5 g of the white PVPC100 polymer is obtained. The $^1$H NMR analysis (500 MHz, CDCl$_3$) result of the PVPC100 polymer is: δ=1.0-2.4 (—CHCH$_2$—, m, 3H), δ=6.2-7.1 (—C$_6$H$_4$— & ArCH=CH—, m, 5H), δ=7.1-7.8 (C$_6$H$_5$CH=CH—, m, 6H), δ=7.77 (ArCH=CH—, m, H).

In this example, the PVPC100 polymer has the chemical formula (I). x is 100%, and y is 0%.

PVPC35-co-B65 (x=35%, y=65%)

A solution comprising poly(vinylphenol)) (3.0 g, Mw=20000 g/mol), 45 mL of anhydrous tetrahydrofuran (THF) and 7.5 mL of tripropylamine is placed in an ice bath for 10 minutes, and then is dissolved in 5 mL of anhydrous tetrahydrofuran solution of trans-3-phenylacryloyl chloride (0.555 g) and benzoyl chloride (2.4 g). After an overnight stirring, the PVPC35-co-B65 polymer is obtained by filtering the reaction mixture and purifying the precipitate polymer. The $^1$H NMR analysis (CDCl$_3$) result of the PVPC35-co-B65 polymer is: δ=1.2-2.2 (m, —CHCH$_2$—), δ=6.2-7.1 (m, —C$_6$H$_4$OH & —CH=CHC$_6$H$_5$), δ=7.1-8.0 (m, —CH=CHC$_6$H$_5$ & 3H, —COC$_6$H$_5$), δ=8.1-8.3 (br.s, 2H, —COC$_6$H$_5$).

PVPC-co-B crosslinkable polymer has the chemical formula (II) of:

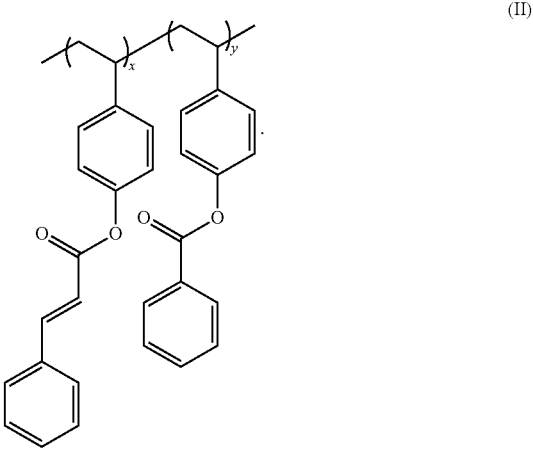

(II)

In this example, x is 35%, and y is 65%.

PVPC60-co-B40 (x=60%, y=40%)

PVPC60-co-B40 polymer (x=60%, y=40%) is manufactured by a method similar with the method the PVPC35-co-B65 polymer (x=35%, y=65%) is manufactured by except that 2.75 g of trans-3-phenylacryloyl chloride and 1.48 g of benzoyl chloride are used for the PVPC60-co-B40 polymer. The $^1$H NMR analysis (CDCl$_3$) result of the PVPC60-co-B40 polymer is: δ=1.2-2.2 (m, —CHCH$_2$—), δ=6.2-7.1 (m, —C$_6$H$_4$OH & —CH=CHC$_6$H$_5$), δ=7.1-8.0 (m, —CH=CHC$_6$H$_5$ & 3H, —COC$_6$H$_5$), δ=8.1-8.3 (br.s, 2H, —COC$_6$H$_5$).

In this example, the PVPC60-co-B40 polymer has the chemical formula (II). x is 60%, and y is 40%.

PVPC60-co-NO$_2$ B40 (x=60%, y=40%)

A solution comprising the PVPC60 polymer (1.5 g) dissolved in 25 mL of anhydrous tetrahydrofuran, and 7.5 mL of tripropylamine is placed in an ice bath for 10 minutes, and then is dissolved in 5 mL of anhydrous tetrahydrofuran solution of 4-nitrobenzoyl chloride (1.5 g). After an overnight stirring, the PVPC60-co-NO$_2$ B65 polymer is obtained by filtering the reaction mixture and purifying the precipitate polymer. The $^1$H NMR analysis (CDCl$_3$) result of the PVPC60-co-NO$_2$ B40 polymer is: δ=1.2-2.2 (m, —CHCH$_2$—), δ=6.2-7.1 (m, —C$_6$H$_4$OH & —CH=CHC$_6$H$_5$), δ=7.1-8.0 (m, —CH=CHC$_6$H$_5$), δ=8.0-8.4 (br.s, 4H, —C$_6$H$_4$—NO$_2$).

The PVPC60-co-NO$_2$ B40 crosslinkable polymer has the chemical formula (III) of:

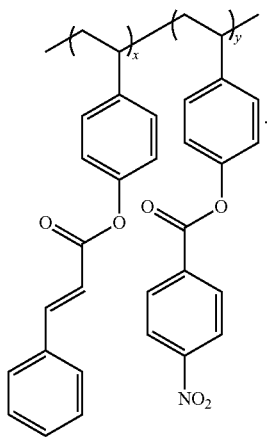

(III)

x is 60%, and y is 40%.

PVPC60-co-hexyl B40 (x=60%, y=40%)

A solution comprising the PVPC60 polymer (1.5 g) dissolved in 25 mL of anhydrous tetrahydrofuran, and 7.5 mL of tripropylamine is placed in an ice bath for 10 minutes, and then is dissolved 5 mL of anhydrous tetrahydrofuran solution of 4-hexylbenzoyl chloride (1.5 g). After an overnight stirring, the PVPC60-co-hexyl B40 polymer is obtained by filtering the reaction mixture and purifying the precipitate polymer. The $^1$H NMR analysis (CDCl$_3$) result of the PVPC60-co-hexyl B40 polymer is: δ=0.8-1.0 (br.s, hexyl-CH$_3$), δ=1.2-2.2 (m, —CHCH$_2$— & hexyl —(CH$_2$)$_4$—), δ=2.4-2.8 (m, hexyl —ArCH$_2$C$_5$H$_{11}$), δ=6.3-7.1 (m), δ=7.1-7.9 (m), δ=7.9-8.2 (br.s, 2H, —COC$_6$H$_4$-hexyl).

The PVPC60-co-hexyl B40 crosslinkable polymer has the chemical formula (IV) of

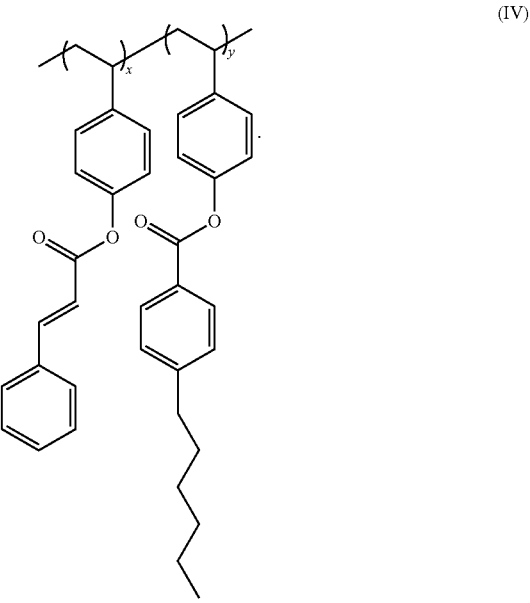

(IV)

x is 60%, and y is 40%.

PVPC60-co-CF$_3$ B40 (x=60%, y=40%)

A solution comprising the PVPC60 polymer (1.5 g) dissolved in 25 mL of anhydrous tetrahydrofuran, and of 37.5 mL tripropylamine is placed in an ice bath for 10 minutes, and then is dissolved 5 mL of anhydrous tetrahydrofuran solution of 4-trifluoromethylbenzoyl chloride (1.5 g). After an overnight stirring, the PVPC60-co-CF$_3$ B40 polymer is obtained by filtering the reaction mixture and purifying the precipitate polymer. The $^1$H NMR analysis (CDCl$_3$) result of the PVPC60-co-CF$_3$ B40 polymer is: δ=0.8-1.0 (br.s, hexyl-CH$_3$), δ=1.2-2.2 (m, —CHCH$_2$—), δ=6.2-7.1 (m), δ=7.1-8.0 (m), δ=8.0-8.4 (m).

The PVPC60-co-CF$_3$ B40 crosslinkable polymer has the chemical formula (V) of:

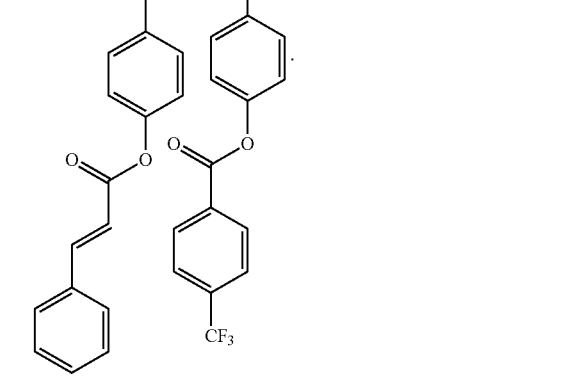

(V)

x is 60%, and y is 40%.

The properties of the dielectric films formed by the crosslinkable polymer (with using the crosslinking agent or without using a crosslinking agent) are disclosed as following. Table 1 shows the polymer composition. Table 2 shows the dielectric constant of the dielectric films. The dielectric film may have a dielectric constant of 2-6.

TABLE 1 polymer composition

| | crosslinkable polymer (a) | melamine derivative (b) | crosslinking agent (c) | weight ratio (a:b:c) |
|---|---|---|---|---|
| example 1 | PVPC19 | | trimethyl acrylate (TMA) | 10:0:5 |
| comparative example 2 | PVPC19 | | | 8:0:0 |
| example 3 | PVPC19 | poly(melamine-co-formaldehyde) (PMF) | dipenta-erythritol hexaacrylate (DPEHA) | 8:6:2 |
| example 4 | PVPC19 | PMF | | 8:8:0 |
| example 5 | PVPC19 | PMFA | | 8:8:0 |
| example 6 | PVPC35 | PMF | DPEHA | 8:6:2 |
| comparative example 7 | PVPC60 | | | 8:0:0 |
| example 8 | PVPC60 | PMF | DPEHA | 8:6:2 |
| comparative example 9 | PVPC100 | | | 8:0:0 |
| example 10 | PVPC100 | PMF | DPEHA | 8:6:2 |
| example 11 | PVP-g-CN100 | PMF | | 8:8:0 |
| comparative example 12 | PVPC35-co-B65 | | | 8:0:0 |
| example 13 | PVPC35-co-B65 | PMF | | 8:8:0 |
| comparative example 14 | PVPC60-co-B40 | | | 8:0:0 |
| example 15 | PVPC60-co-B40 | PMF | | 8:8:0 |
| comparative example 16 | PVPC60-co-NO₂ B40 | | | 8:0:0 |
| comparative example 17 | PVPC60-co-CF₃ B40 | | | 8:0:0 |
| comparative example 18 | PVPC60-co-hexyl B40 | | | 8:0:0 |
| example 19 | PVPC60-co-NO₂ B40 | PMF | | 8:8:0 |
| example 20 | PVPC60-co-CF₃ B40 | PMF | | 8:8:0 |
| example 21 | PVPC60-co-hexyl B40 | PMF | | 8:8:0 |
| comparative example 22 | PVP | PMF | | 8:8:0 |
| example 23 | PVPC60 | PMF | | 8:8:0 |
| example 24 | PVPC70 | PMF | | 8:8:0 |

TABLE 2 dielectric constant of dielectric film

| | dielectric constant |
|---|---|
| comparative example 2 | 5.74 |
| example 3 | 4.51 |
| example 5 | 2.94 |
| example 6 | 3.92 |
| comparative example 7 | 3.94 |
| example 8 | 3.72 |
| comparative example 9 | 3.27 |
| example 10 | 3.94 |
| example 11 | 3.78 |
| comparative example 12 | 3.32 |
| example 13 | 3.35 |
| comparative example 14 | 3.70 |
| example 15 | 3.93 |
| comparative example 16 | 3.08 |
| comparative example 17 | 2.99 |
| comparative example 18 | 3.23 |
| example 19 | 3.45 |
| example 20 | 3.39 |
| example 21 | 3.38 |
| comparative example 22 | 4.75 |
| example 23 | 3.93 |
| example 24 | 3.67 |

Metal-Insulator-Metal (MIM) Capacitor Structure

A manufacturing method for a MIM capacitor structure may comprise forming a dielectric film on an indium-tin-oxide (ITO) substrate. Next, a top golden electrode is formed on the dielectric film by a vacuum deposition method (the bond pad area is 0.000415 cm$^2$). As such, the MIM capacitor structure is finished. The method for forming the dielectric film comprise coating a mixture comprising the polymer composition as shown in table 1 dissolved in the solvent such as propylene glycol monomethylether acetate (PGMEA) on the substrate. The substrate is baked at 100□ for 10 minutes. Next, the film is crosslinked by irradiating UV light (for example, of wavelength of 254 nm for 30 minutes, an exposure dose of 1.8 J/cm$^2$) for forming the dielectric film.

FIG. 1 illustrates I-V response results of the MIM capacitor structures of comparative example 2, example 3 and example 4. The I-V response is measured by using the Keithley 236 under the air environment. From FIG. 1, it is found that the leakage current of the MIM capacitor structure having the dielectric film formed from the polymer composition of comparative example 2 is about $10^{-6}$ A/cm$^2$. The leakage current of the MIM capacitor structure having the dielectric film formed from the polymer composition of example 3 or example 4 is dramatically reduced by one or two orders. Therefore, the insulating property of the dielectric film of example 3 and example 4 is much better than that of comparative example 2.

Figure 2:
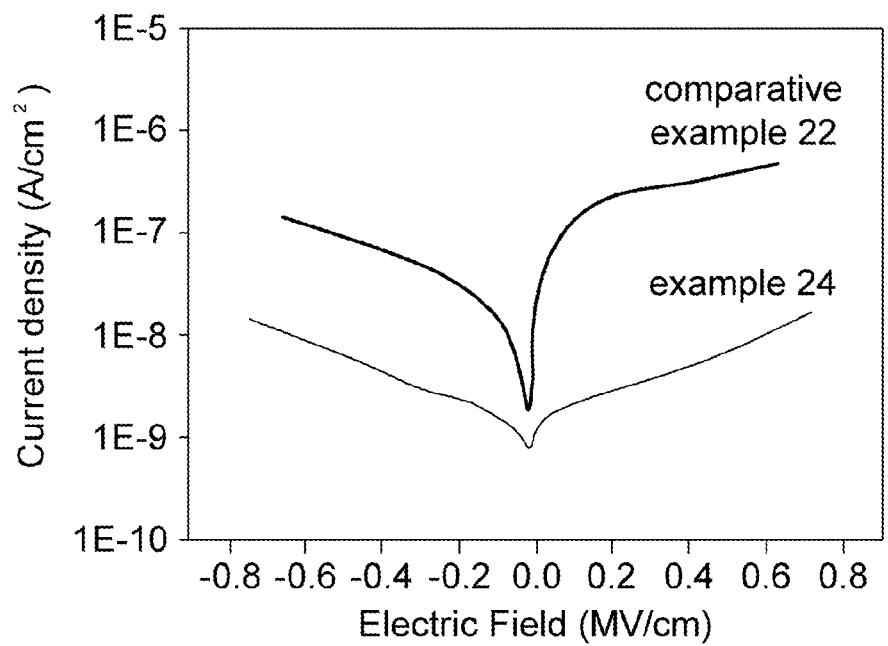
FIG. 2 illustrates I-V response results of the MIM capacitor structures of comparative example 22 and example 24.

FIG. 2 illustrates I-V response results of the MIM capacitor structures of comparative example 22 and example 24. From FIG. 2, it is found that the leakage current of the MIM capacitor structure having the dielectric film formed by using PVPC70/PMF (example 24) is much lower, by about 1-2 orders, than the leakage current of the MIM capacitor structure having the dielectric film formed by using PVP/PMF (comparative example 22; e.g. $10^{-6}$ A/cm$^2$ at ±40 V), as the dielectric films both are formed by using the same irradiation condition, such as irradiating UV light of wavelength of 365 nm for 20 minutes. The insulating property improvement of the dielectric film manufactured by using composition comprising PVPC70/PMF is due to the high degree of cross-linking network structure contributed from cinnamate-substituted groups in PVPC70 to reduce the free volume, which resulted in the increase in dielectric breakdown strength. The cross-linking network structure can be verified with the acetone treatment results. It is observed the dielectric film formed by using PVPC70/PMF is resistant to acetone treatment after exposed to 365 nm irradiation for 20 min, and the leakage current shows no significantly increase after treating with acetone. This solvent resistance due to cross-linking network structure also enables process capability with traditional photolithography process.

Figure 3:
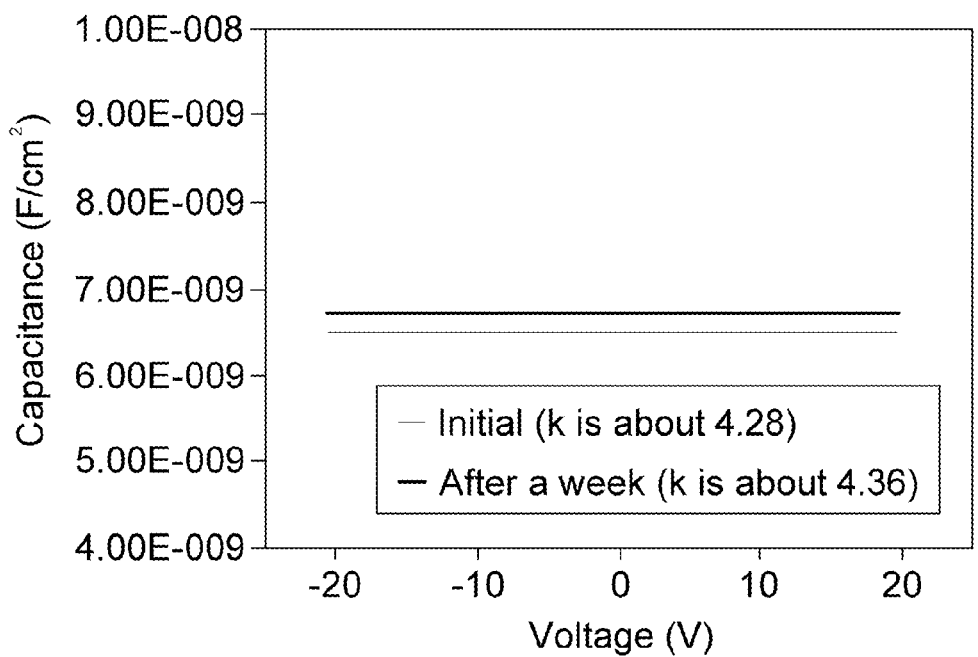
FIG. 3 illustrates C-V response results of the MIM capacitor structures having the dielectric film formed from the composition of example 3.
Figure 4:
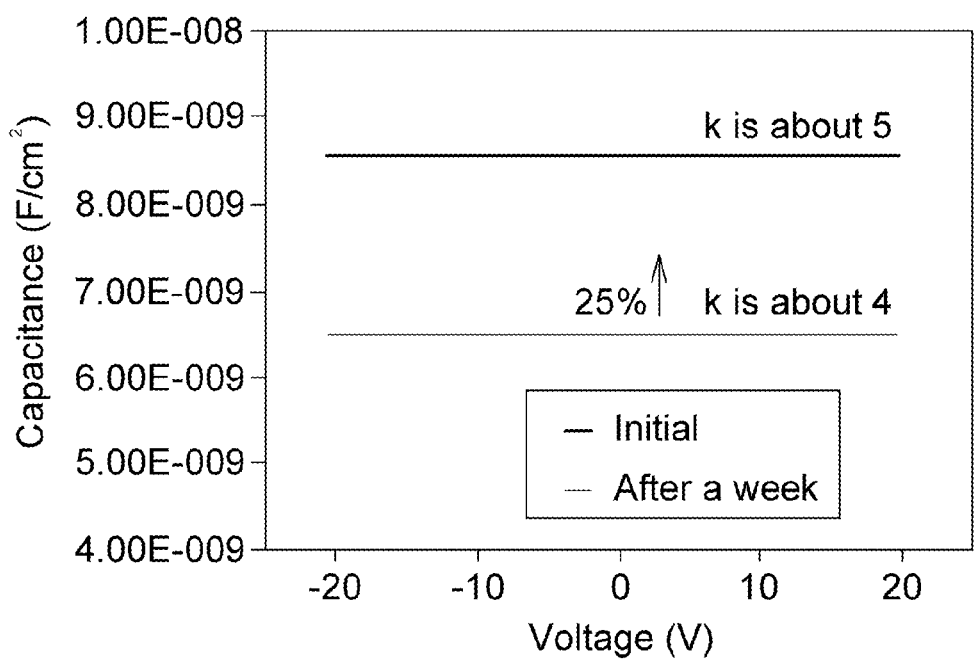
FIG. 4 illustrates C-V response results of the MIM capacitor structures having the dielectric film formed from the composition of comparative example 22.

FIG. 3 illustrates C-V response results of the MIM capacitor structures having the dielectric film formed from the polymer composition of example 3. FIG. 4 illustrates C-V response results of the MIM capacitor structures having the dielectric film formed from the polymer composition of comparative example 22. The C-V response is measured by using the Keithley CV 590 under the air environment. From the results, it is found that the stability in the atmosphere of the comparative example 22 (FIG. 4), the capacitance of which increases through the time (one week), is worse than that of example 3. The capacitance of example 3 (FIG. 3) does not change almost.

Solvent Resistance of Dielectric Film

The dielectric film formed from the polymer composition of example 3 does not crack after soaking in a solvent of PGMEA and acetone for 20 minutes. On the contrary, the dielectric film formed from the polymer composition of comparative example 22 seriously cracks after soaking in a solvent of PGMEA and acetone for 20 minutes. It is proved that the polymer composition of embodiments of the present disclosure can be used for forming the dielectric film having excellent solvent resistance.

Organic Thin Film Transistor (OTFT)

In this example, a bottom gate/top contact OTFT comprises an active layer of poly(3-hexylthiophene) (P3HT). The crosslinked polymer compound manufactured from the polymer composition is used as a gate dielectric layer.

A coating solution, comprising the polymer composition dissolved in a solvent such as PGMEA and coated on a heavily-doped chip is backed at 100☐ for 20 minutes and then irradiated by UV light (for example, of wavelength of 254 nm, 50 W for 20 minutes, an exposure dose of about 1.2 J/cm$^2$) for forming a undissolvable cured crosslinked film. Before coating an organic semiconductor layer, the surface of the crosslinked film is treated by an organic silane molecule (such as OTS) for forming a self assembled monolayer (SAM), improving the efficiency of the OTFT device. The OTS treating method comprises depositing OTS vapor in a chamber. Next, a P3HT polymer is deposited on the OTS. A golden source electrode and a golden drain electrode are formed by a thermal evaporation method using a mask. A channel width and a channel length of the device may be 250 μm and 50 μm, respectively.

Figure 5:
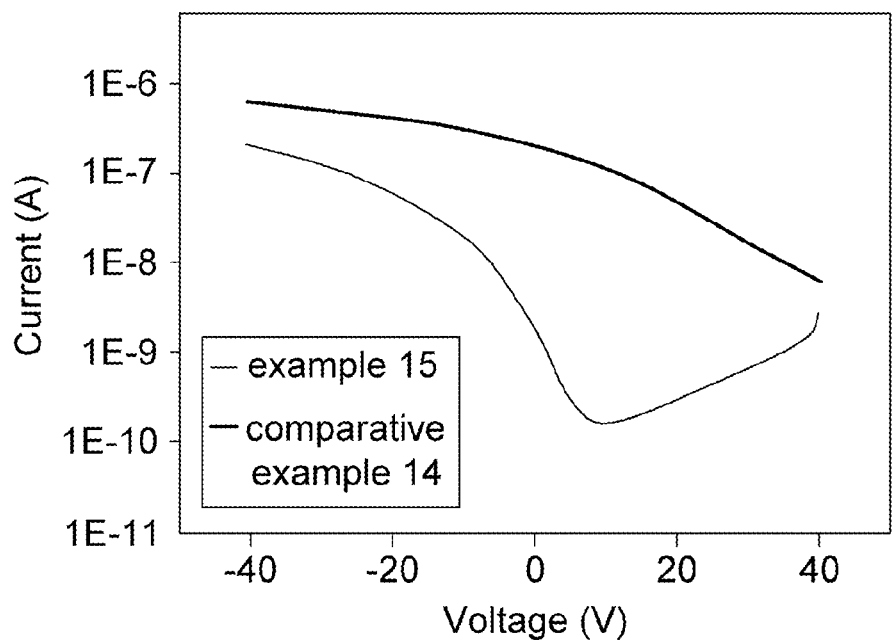
FIG. 5 illustrates I-V curves of the OTFTs having the gate dielectric films manufactured from the compositions of comparative example 14 and example 15.

FIG. 5 illustrates I-V curves of the OTFTs having the dielectric films manufactured from the polymer compositions of comparative example 14 and example 15. For the OTFT of example 15, the hole mobility is 0.007 cm$^2$/V s. The on/off ratio is about 1.58E+3. The threshold voltage (Vth) is 2.36V. In addition, the Ss is about 7.1 V/dec. For the OTFT of comparative example 14, the hole mobility is 0.007 cm$^2$/V s. The on/off ratio is about 1.05E+2. The threshold voltage is 39.23V. In addition, the Ss is about 22.4 V/dec. From the results, it is found that the device efficiency of the OTFT of example 15 is better than that of comparative example 14.

Figure 6:
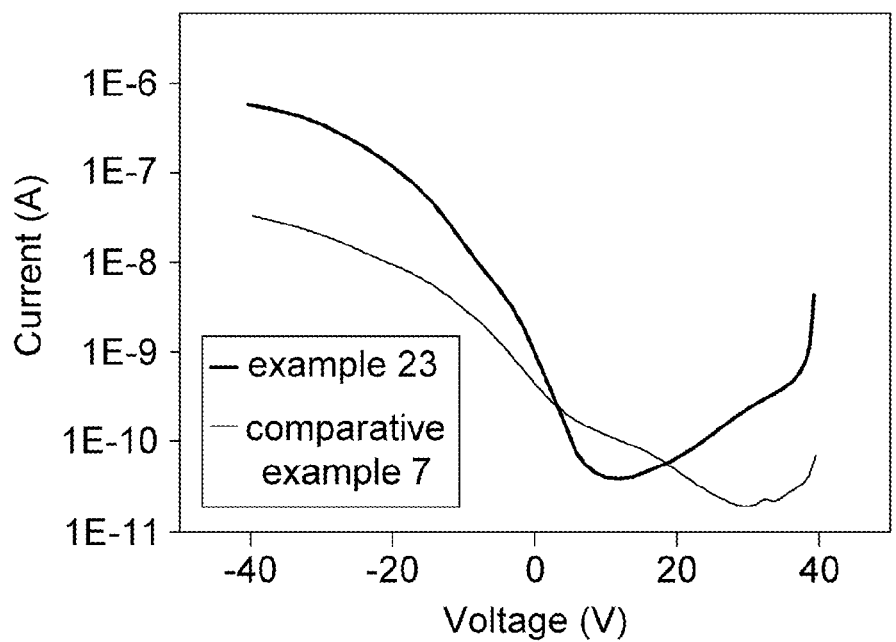
FIG. 6 illustrates I-V curves of the OTFTs having the gate dielectric layers manufactured from the compositions of comparative example 7 and example 23.

FIG. 6 illustrates I-V curves of the OTFTs having the dielectric films manufactured from the polymer compositions of comparative example 7 and example 23. For the OTFT of example 23, the hole mobility is 4.0E-2 cm$^2$/V s. The on/off ratio is about 2.00E+4. The threshold voltage is −8.42V. The Ss is about 6.05 V/dec. For the OTFT of comparative example 7, the hole mobility is 1.3E-3 cm$^2$/V s. The on/off ratio is about 2.35E+3. The threshold voltage is 3.31 V. The Ss is about 15.4 V/dec. From the results, it is found that the hole mobility and the on/off ratio of the OTFT of example 23 is better than that of comparative example 7. In addition, the Ss of the OTFT of example 23 is smaller than that of comparative example 7. Therefore, the device efficiency of the OTFT of example 23 is higher than that of comparative example 7.

Table 3 shows leakage current results of the MIM having the dielectric layer of crosslinked polymer compound of example 1 to 21 shown in table 1.

TABLE 3

| | MIM property | |
|---|---|---|
| | Thickness of gate dielectric layer (nm) | leakage current (A) |
| example 1 | 552 | 1.03E−6(at 0.54 MV/cm) |
| comparative example 2 | 565 | 1.67E−6(at 0.71 MV/cm) |
| example 3 | 576 | 3.18E−8(at 0.69 MV/cm) |
| example 4 | 604 | 1.23E−7(at 0.66 MV/cm) |
| example 5 | 789 | 2.74E−7(at 0.8 MV/cm) |
| example 6 | 451 | 1.58E−8(at 0.8 MV/cm) |
| comparative example 7 | 586 | 1.21E−8(at 0.8 MV/cm) |
| example 8 | 503 | 9.03E−9(at 0.68 MV/cm) |
| comparative example 9 | 610 | 2.94E−9(at 0.65 MV/cm) |
| example 10 | 519 | 1.66E−9(at 0.77 MV/cm) |
| example 11 | 509 | 3.10E−9(at 0.8 MV/cm) |
| comparative example 12 | 712 | 2.29E−9(at 0.5 MV/cm) |
| example 13 | 500 | 3.83E−8(at 0.8 MV/cm) |
| comparative example 14 | 701 | 3.83E−9(at 0.78 MV/cm) |
| example 15 | 553 | 1.25E−7(at 0.8 MV/cm) |
| comparative example 16 | 543 | 5.15E−9(at 0.8 MV/cm) |
| comparative example 17 | 554 | 2.55E−9(at 0.72 MV/cm) |
| comparative example 18 | 600 | 7.73E−9(at 0.63 MV/cm) |
| example 19 | 513 | 6.24E−9(at 0.8 MV/cm) |
| example 20 | 700 | 1.68E−9(at 0.57 MV/cm) |
| example 21 | 476 | 6.62E−9(at 0.68 MV/cm) |

Example 25

In example 25, the polymer composition comprises the crosslinkable polymer PVPC60-co-B40 (80 mg), the melamine derivative (for example, PMF, 80 mg), and the additive aging siloxane (for example, TEGO Wet KL 245, 20 mg). The crosslinked polymer compound formed in example 25 may be used as the gate dielectric layer of the OTFT. The method for forming the OTFT comprises dissolving the polymer composition of example 25 in the PGMEA. The mixture is coated onto the substrate. Next, the substrate is backed at 1000 for 10 minutes and then irradiated by UV light (for example, of wavelength of 254 nm for 20 minutes, an exposure dose of 1.2 J/cm$^2$) for crosslinking the film. Before coating the organic semiconductor layer, the surface of the crosslinked film is treated by an organic silane molecule OTS for forming a self assembled monolayer (SAM) for improving the efficiency of the OTFT device. The OTS treating method comprises depositing OTS vapor in a chamber. Next, a P3HT polymer is deposited on the OTS. A golden source electrode and a golden drain electrode are formed by a thermal evaporation method using a mask. A channel width and a channel length of the device may be 250 μm and 50 μm, respectively. The OTFT device has a hole mobility of 0.005 cm$^2$/Vs, an on/off ratio of about 1350, and a threshold voltage of −13.65V.

Example 26

In example 26, the polymer composition comprises the crosslinkable polymer PVPC60-co-B40 (80 mg), the melamine derivative (for example, PMF, 80 mg), the crosslinking agent DPEHA (20 mg), and the photoinitiator benzophenone (10 mg). The crosslinked polymer compound of example 26 may be used as the dielectric layer of the MIM capacitor structure. The method for forming the dielectric film comprises dissolving the crosslinkable polymer composition of example 26 in the PGMEA. The mixture is coated onto the substrate. Next, the substrate is backed at 100☐ for 10 minutes and then irradiated by UV light (for example, of wavelength of 365 nm for 20 minutes, an exposure dose of about 13.2 J/cm²) for crosslinking the film. The leakage current of the MIM is $1.6 \times 10^{-8}$ A/cm²@20V.

Example 27

In example 27, the polymer composition comprises the crosslinkable polymer PVPC60-co-B40 (80 mg), the melamine derivative (for example, PMF, 80 mg), the crosslinking agent DPEHA (20 mg), and the photoinitiator 2-hydroxyl-2-methyl propiophenone (10 mg). The crosslinked polymer compound of example 27 may be used as the dielectric film of the MIM capacitor structure. The MIM of example 27 is manufactured by a method similar with the manufacturing method for the MIM of example 26. The leakage current of the OTFT is $1.8 \times 10^{-8}$ A/cm²@20V.

Example 28

In example 28, the polymer composition comprises the crosslinkable polymer PVPC60-co-B40 (80 mg), the crosslinking agent triallyl isocyanurate (TAIC) (80 mg), and azobisisobutyronitrile (AIBN) (1 mg). The crosslinked polymer compound of example 28 may be used as the dielectric film of the MIM capacitor structure. The MIM of example 28 is manufactured by a method similar with the manufacturing method for the MIM of example 26 except that the film is crosslinked by irradiating UV light of wavelength of 254 nm for 50 minutes, an exposure dose of about 3.0 J/cm². The leakage current of the MIM is $1.5 \times 10^{-8}$ A/cm²@0.8 MV/cm.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A composition, comprising:
a polymer having a chemical formula of:

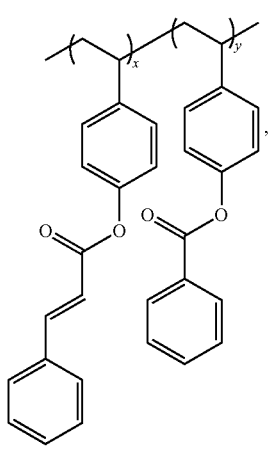

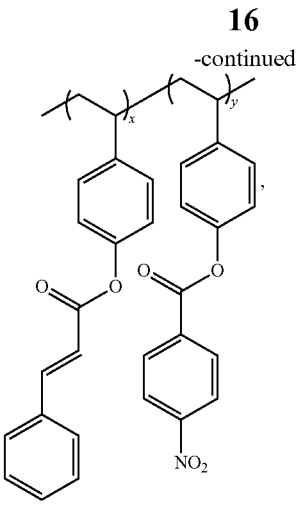

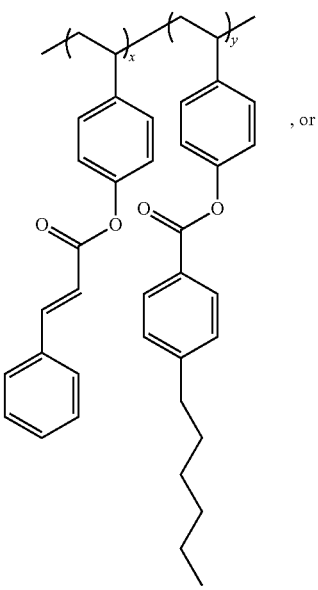

, or

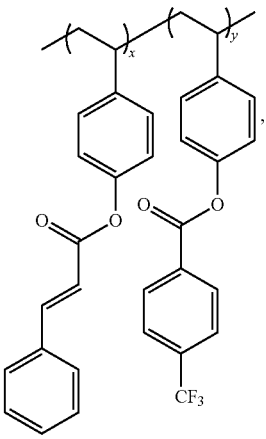

wherein x+y=1, x>0, y>0; and a melamine derivative, comprising

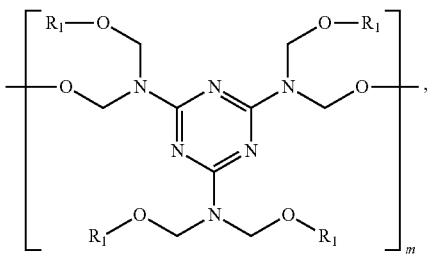

wherein $R_1$ is hydrogen, $C_qH_{2q+1}$ or

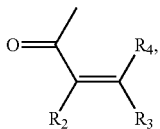

m and q independently is 1-10 of integer, $R_2$, $R_3$ and $R_4$ independently is hydrogen, halide, or $C_1$-$C_{54}$ alkyl group.

2. The composition according to claim 1, further comprising a crosslinking agent, wherein the crosslinking agent comprises

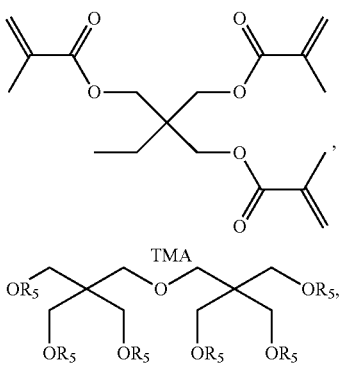

-continued

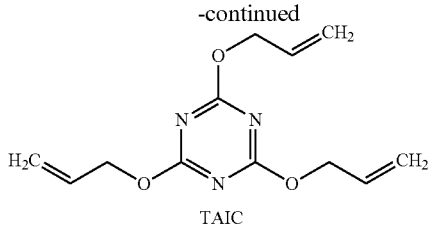

or a combination thereof, wherein, $R_5$ is hydrogen or

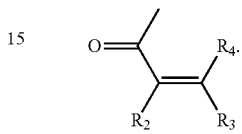

3. The composition according to claim 1, further comprising an additive agent, wherein the additive agent comprises siloxane, benzophenone, 2-hydroxyl-2-methyl propiophenone, azobisisobutyronitrile or a combination thereof.

4. The composition according to claim 1, further comprising a photoinitiator.

5. The composition according to claim 1, wherein the composition is used for forming a crosslinked polymer compound, wherein the crosslinked polymer compound is a dielectric material.

6. The composition according to claim 5, wherein the crosslinked polymer compound has a dielectric constant of 2-6.

7. The composition according to claim 5, wherein the dielectric material is used for a capacitor structure.

8. The composition according to claim 5, wherein the dielectric material is used as a gate dielectric layer of an organic thin film transistor.

9. The composition according to claim 1, wherein the composition is crosslinked by irradiating.

10. The composition according to claim 9, wherein the composition is crosslinked by irradiating with UV light of an exposure dose of 0.5-20 J/cm$^2$.

* * * * *